United States Patent [19]

Maher, Jr. et al.

[11] 4,381,965

[45] May 3, 1983

[54] MULTI-PLANAR ELECTRODE PLASMA ETCHING

[75] Inventors: Joseph A. Maher, Jr., Hamilton; Arthur W. Zafiropoulo, Manchester, both of Mass.

[73] Assignee: Drytek, Inc., Wilmington, Mass.

[21] Appl. No.: 337,372

[22] Filed: Jan. 6, 1982

[51] Int. Cl.³ .............................................. C23C 15/00
[52] U.S. Cl. .................................. 156/345; 156/643; 204/192 E; 204/298; 219/121 PP; 219/121 PG; 414/417
[58] Field of Search ............................... 156/345, 643; 204/192 E, 298, 164; 219/121 PD, 121 PG; 414/416, 417, 300, 403

[56] References Cited

U.S. PATENT DOCUMENTS

| | | | |
|---|---|---|---|
| 3,450,617 | 6/1969 | Hellund | 204/164 |
| 4,178,877 | 12/1979 | Kudo | 156/643 |
| 4,223,048 | 9/1980 | Engle | 204/192 E |
| 4,252,595 | 2/1981 | Yamamoto et al. | 156/345 |
| 4,264,393 | 4/1981 | Gorin et al. | 156/345 |
| 4,277,321 | 7/1981 | Bartlett et al. | 156/643 |
| 4,282,077 | 8/1981 | Beauill | 204/192 E |
| 4,285,800 | 8/1981 | Welty | 156/345 |
| 4,287,851 | 9/1981 | Dozier | 204/192 E |
| 4,289,598 | 9/1981 | Engle | 156/345 |
| 4,313,783 | 2/1982 | Davies et al. | 156/345 |
| 4,336,438 | 6/1982 | Uehora et al. | 156/643 |
| 4,341,582 | 7/1982 | Kohman et al. | 156/345 |

OTHER PUBLICATIONS

Davidse, 'Masking . . . Etching', IBM Technical Disclosure Bull., vol. 8, No. 8, (1/66), pp. 1030–1031.

*Primary Examiner*—Jerome W. Massie
*Attorney, Agent, or Firm*—James E. Mrose

[57] ABSTRACT

Dry plasma etching of a plurality of planar thin-film semiconductor wafers is effected simultaneously and uniformly in a relatively small chamber enveloping a vertically-stacked array of laminar electrode sub-assemblies each of which includes a pair of oppositely-excited electrode plates tightly sandwiching a solid insulating layer of dielectric material, the parallel sub-assemblies being vertically separated to subdivide the chamber into a plurality of reactor regions where RF discharges can excite a normally inert ambient gas to develop reactive plasma for simultaneous planar plasma etching or reactive ion etching (RIE) of all wafers within the several regions. The upper plates of the electrode sub-assemblies, which support the wafers during etching, are at any instant all maintained at the same potential, whether RF or ground in the different modes of operation, and fluid coolant is forced through a distribution of internal passageways in those support plates; all lower plates of the pairs are simultaneously maintained at the opposite potential, whether ground or RF, and the intervening insulating dielectric layers in the sub-assemblies are relatively thin while at the same time providing critical electrical isolation and curbing spurious discharge without serious electrical mismatching. Uncomplicated transport of individual wafers between vertically-stacked positions in a cassette and the stacked array of etching regions is accomplished from below by a reciprocatable arm which is receivable within accommodating slots recessed into the upper cooled electrode plates alongside one edge of the stacked array; programmed vertical movements of the cassette and electrode array allow for appropriate loading and unloading of wafers, and for proper orientation of the reactor regions in relation to the enclosing chamber and associated equipment.

17 Claims, 9 Drawing Figures

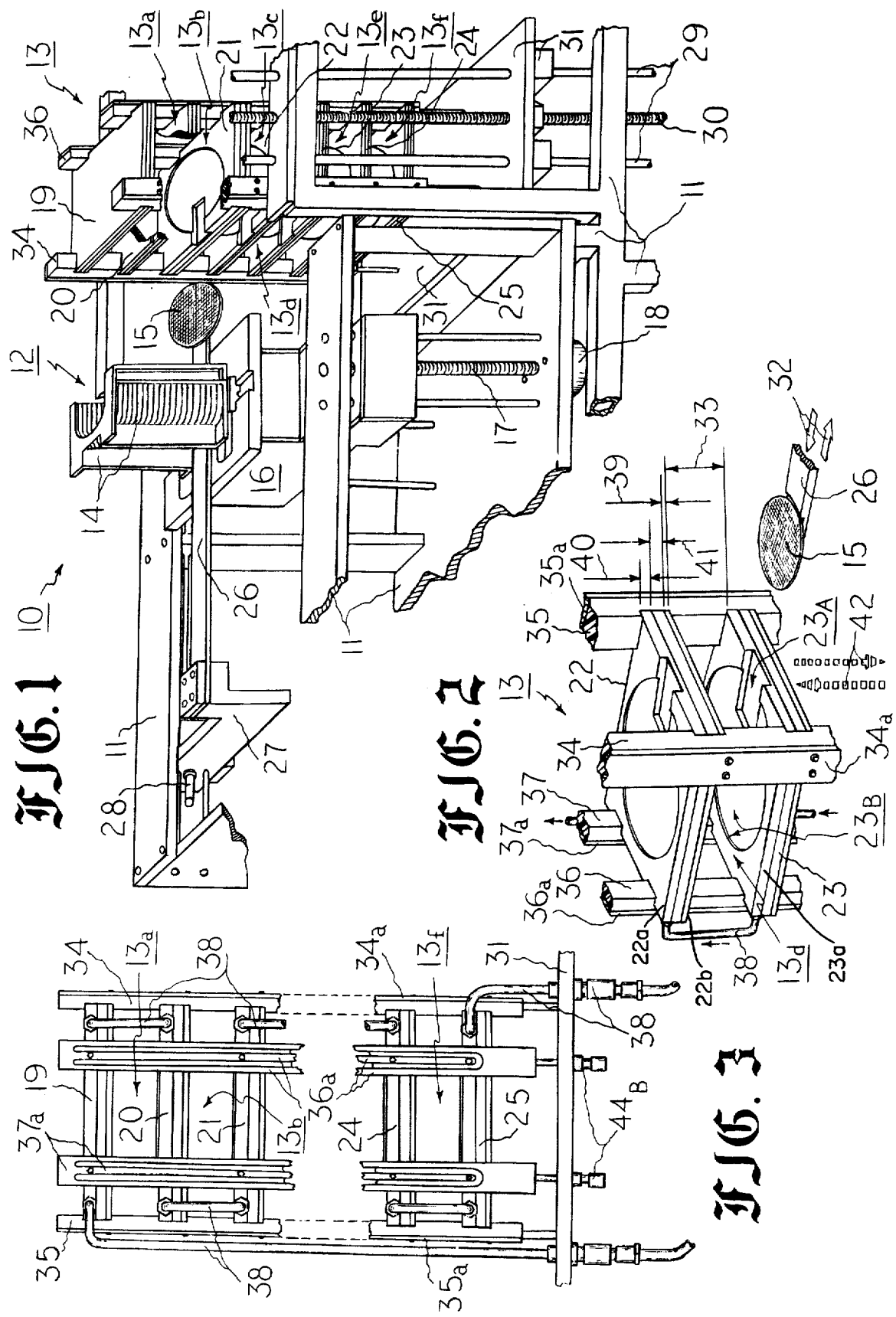

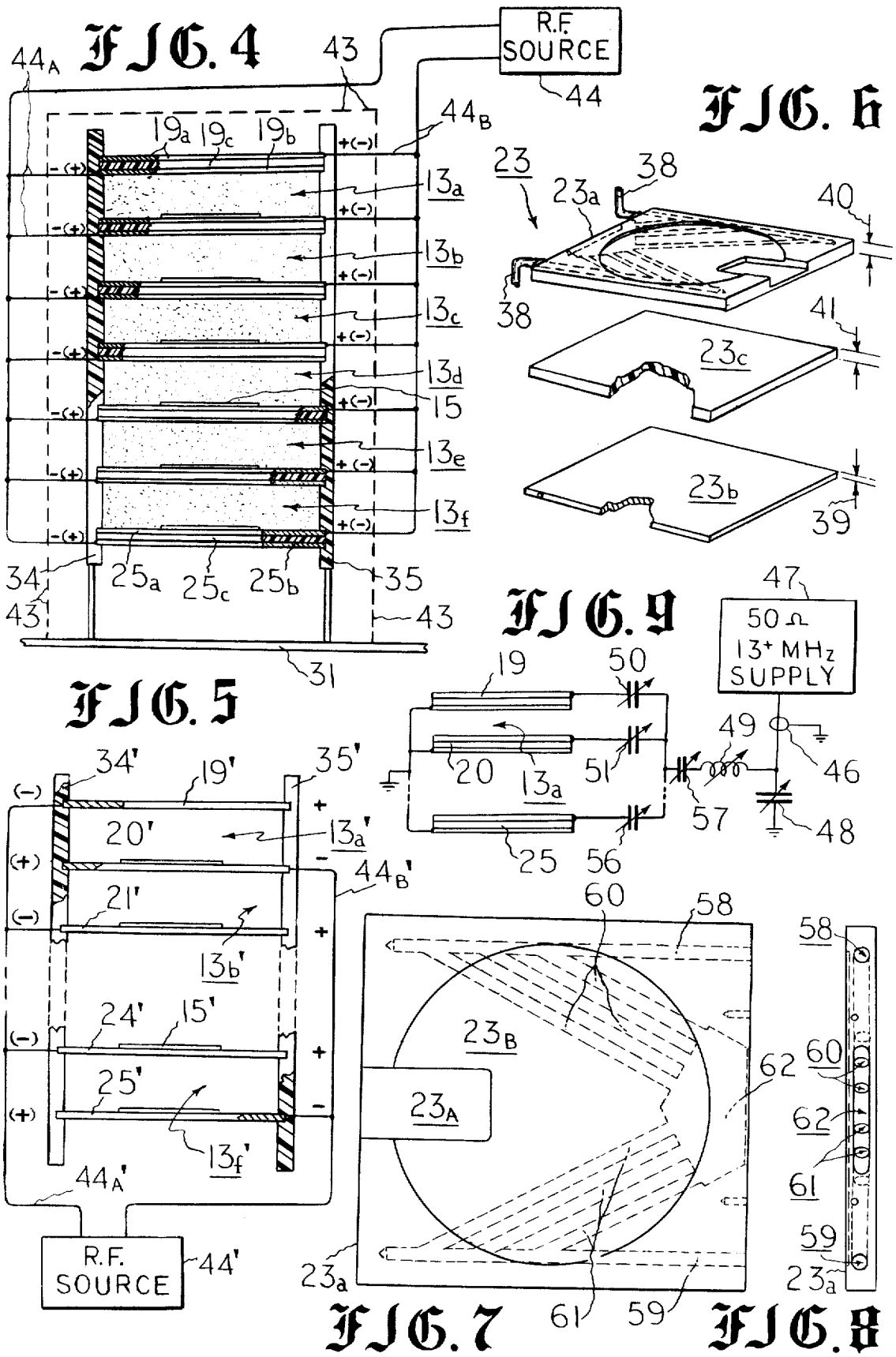

MULTI-PLANAR ELECTRODE PLASMA ETCHING

BACKGROUND OF THE INVENTION

The present invention relates to improvements in gas plasma reactors and the like in which there is deposition or etching of electronic microcircuitry or devices, and, in one particular aspect, to novel and improved dry plasma etching uniformly and simultaneously in a plurality of regions compactly arrayed and uniquely energized to promote optimum quantity and quality of yield from efficiently-used space.

As electronic devices and networks have become reduced in size and proliferated in myriad intricate forms which must be produced with extraordinary precision in vast numbers, thin-film and mirco-line technology and automated expressions of it have correspondingly become increasingly critical. It is well known, for example, that exceedingly thin layers of material can be deposited and shaped to form microscopically-dimensioned details of circuit components, miniature semiconductor devices, or electrical connections, insulation or passageways. Basic techniques for phototgraphically reducing and multiplying such details, and for selectively masking, altering properties, and reacting with the materials involved, have been generally well established in the art for some time; however, needs for ever greater densities of linework having sharper definitions and finer dimensions have increasingly led to exploitations of "dry" reaction techniques which offer alternative attractive prospects for meeting such exacting demands. Unlike wet practices, wherein baths or sprays provide a liquid medium through which depositions or chemical changes or etchings can be induced, comparable dry procedures are conventionally carried out in certain gaseous environments which are activated by applied electrical excitations causing ionizations and glow discharges. By way of example, dry etching may involve ion-bombardment, in which inert ions generated in an RF plasma are accelerated to impinge upon and dislodge atoms from a workpiece, or, in the case of chemical plasma etching, the RF excitation may convert a normally inert gas to a selectively-reactive plasma which diffuses into unmasked workpiece surfaces and develops chemical etching transformations. Plasma etchers of a so-called "planar" configuration are currently preferred in many etching systems, and these include parallel-plate electrodes on which wafers may be rested directly, the supporting plate being made an anode when chemical etching is to dominate and a cathode when a physical or ion-milling type process is to dominate (the latter being known as RIE or reactive ion etching). Even when the wafers are relatively large, however, production one at a time is relatively slow and expensive in such planar etchers, and, when wafers are batched together between large-area electrodes it is difficult to establish operating conditions which will insure that all are uniformly and similarly processed.

The most scrupulous isolation from contaminations is essential in such processing, because even very minute foreign particles or deposits can be ruinous of fine and intricate circuits and devices being processed; high costs of clean-room environments needed to insure such isolations dictate that the dry plasma procedures and equipment should command a very minimum of space. For like economic and quality-control reasons, highly automatic and high-volume production are prime objectives, and it is further advantageous if standard types of cassettes in which wafers are commonly processed into and out of other stages of production can be accommodated also in the dry plasma processing. In addition, it is particularly desirable that electrical and mechanical characteristics of the etching be conducive to the reliable production of uniform-quality precision outputs, in quantity, and that they allow either conventional chemical-type or RIE modes of etching.

Among prior practices which have been described in respect of gas plasma reactors is that involving a pair of planar horizontal electrodes sealed within a housing together with an atmosphere such as carbon tetrafluoride gas and excited by an RF signal to generate a discharge plasma which will etch the surface film on a silicon-base semiconductor wafer, as reviewed in U.S. Pat. No. 4,222,838, for example. Multiple vertically-arranged electrode pairs, of like polarities, were illustrated in the gas plasma etching system of U.S. Pat. No. 4,282,077, together with electrical controls aimed at rendering the etchings of circuit boards more uniform. Cooling of electrodes to improve uniformity has been described in U.S. Pat. No. 4,275,289, and apparatus for automating the transfers of wafers for processing has been disclosed in U.S. Pat. No. 4,062,463.

SUMMARY OF THE INVENTION

The present invention is aimed at improving the speed, convenience, effectiveness, precision and costs of interacting electronic microcircuits and devices with dry gas plasmas, and, in particular, at effecting economies and efficiency in gas plasma etching by reacting the individual wafers of batches of semiconductor wafers, simultaneously, in the separate plasmas generated between similarly-polarized electrodes in a compact vertically-stacked array. In one preferred embodiment, the sealable chamber of an etcher, wherein workpieces in the form of semiconductor wafers are to be exposed to a suitable gas ionizable in response to an applied RF signal, is proportioned to receive and envelop a vertically-elongated and vertically-movable compact subassembly of dual-electrode structures. Each such structure is a thin composite comprising a pair of relatively thin planar conductors in sandwiching relation to a relatively thin layer of solid insulating material which has excellent dielectric properties, and the respective laminated composite electrode structures are compactly stacked horizontally one above the other in a spaced and insulated parallel array with like relatively small vertical gaps between the successive laminated electrode structures. RF excitation is applied to polarize corresponding upper and lower ones of the planar conductors similarly at any instant, and to develop substantially uniform potentials across the several vertical gaps which will ionize a normally inert gas or gas mixture introduced into the chamber for purposes of plasma interactions with wafers which have been placed within the gaps and rest upon the upwardly-facing planar conductors. For the latter purposes, such wafers are processed to and from the chamber by way of a standard cassette or rack in which the several wafers are edge-supported in vertically-stacked relationship, the etcher including a station adjacent the reaction chamber where a horizontally-reciprocatable transport arm is operated to move wafers from various levels of the vertically-indexed cassette and load them onto the receiving surfaces of the upwardly-facing planar conductors, automatically. Unloading, after etching, involves the reverse automated movements. The planar conductors upon which the wafers are carried during the etching are maintained uniformly cool by forced coursings of liquid through internal passageways, and electrical excitations which advantageously preserve substantially the same electrical conditions in the several gas-filled gaps are provided by related splitting of the RF from a single source.

Accordingly, it is one of the objects of this invention to provide novel and improved dry plasma batch processing in which a plurality of workpieces may be simultaneously treated in a compactly-stacked relationship while similarly polarized and similarly interacting with substantially identical ionized-gas environments.

A further object is to provide unique and advantageous plasma etchers occupying small space and offering high-capacity throughputs of precisely-controlled etched wafers treatable optionally in either conventional or RIE modes, such etchers being adapted to the automated processing of cassette-racked wafers.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

FIG. 1 is an illustration in perspective of key portions of an improved multi-planar electrode etcher, certain of the parts being broken away to expose structural details;

FIG. 2 provides another view of a section of the movable stacked-electrode sub-assembly which is found in the etcher of FIG. 1, together with characterizations of dimensions and of movements relative to an associated wafer-transfer mechanism;

FIG. 3 portrays the same stacked-electrode sub-assembly from a back side where coolant and electrical bus-bar provisions are more clearly revealed;

FIG. 4 is a partly schematic and partly pictorial representation of the stacked-electrode sub-assembly, together with instantaneous potential designations and characterizations of plasma discharges;

FIG. 5 illustrates an electrode sub-assembly, and the attendant excitation conditions, involving directly-interleaved single electrodes;

FIG. 6 supplies an "exploded" and partly fragmented view of one pair of electrodes sandwiched about an insulating dielectric member to form one of the multiple-electrode units of which improved sub-assemblies such as those of FIGS. 1-4 are constructed;

FIG. 7 is a plan view of an upper view of a pair such as that shown in FIG. 6, together with dashed-line representations of internal coolant-flow passages;

FIG. 8 views the right end of the electrode appearing in FIG. 7; and

FIG. 9 is a schematic and block-diagrammed characterization of a preferred arrangement for electrical excitation of the improved multi-planar electrode sub-assembly.

DETAILED DESCRIPTION OF THE PREFERRED EMBODIMENTS

Having reference to the drawings, wherein like reference characters designate identical or corresponding parts throughout the several views, and more particularly to FIG. 1 thereof, one embodiment of an improved dry gas plasma etcher, 10, is shown to include rigid interconnected stationary framework members 11 on which are mounted the elements of a cassette-type wafer transfer station 12 and of an elevator-type multiple-electrode mechanism 13, the latter being disposed to raise and lower a vertically-stacked array of substantially planar paired-electrode units which define plasma-discharge regions within what is essentially a known bell-jar type of vacuum chamber (not shown). A sturdy precision-made ribbed cassette 14, designed for the compact vertical stacking of a plurality of horizontally-loaded and -unloaded flat circular semiconductor wafers, such as wafer 15, allows for the batch transport and processing of such vulnerable workpieces without contamination or other injury due to operator mishandling, and is disposed atop an elevator platform structure 16 movable vertically on guide rods by a screw-threaded actuator rod 17 rotated by a suitable motor 18 at the transfer station 12. The wafer-laden cassette supplies a number of wafers 15 each having upper surfaces and regions representing a multiplicity of partly-processed microcircuits and/or semiconductor devices, or the like, which are to be further processed by interaction with gas plasma, for example to etch spaces between fine conductive linework by ion bombardments or chemical-type etching, or both, as referred to hereinabove. Such plasmas are generated one for each of a batch of up to six wafers in the illustrated multiple-electrode mechanism 13, where there are six gas-discharge or plasma regions, 13a through 13f, between adjacent ones of the vertically-stacked paired-electrode units 19 through 25. Those electrode units which have upwardly-facing surfaces at the bottoms of the plasma regions are preferably recessed slightly, downwardly, as shown, circularly to accommodate thin circular wafers in a substantially flush relation to marginal areas thereof, and laterally inwardly from the transfer-station side, to accommodate the tip of a reciprocatable wafer-supporting transfer arm 26 which serves to move the wafers between the cassette 14 and the plasma regions. Transfer station 12 is generally like the cassette load mechanism described in U.S. Pat. No. 4,062,463, and includes a guided slidable carrier 27 to which the transfer arm 26 is fixed and which is itself moved back and forth by a piston rod 28 pneumatically driven by a pneumatic piston-cylinder assembly (not visible).

Utilizing associated switches and controls such as are discussed in greater detail in said U.S. Pat. No. 4,062,463, the transfer station is readied to transfer a wafer from the cassette by poising its arm in a fully retracted position, where its tip will underlie and be engaged by the lowest wafer in the cassette 14 as the cassette is lowered by its elevator platform structure 16. A pneumatic sensor on that transfer-arm tip (not shown) detects the engagement and thereby stops the cassette lowering, next actuating the pneumatic piston rod 28 to move the transfer arm 26 toward the electrode mechanism 13 with the engaged wafer 15 supported at its tip. At that time, the chamber in which the electrode mechanism is to be sealed is laterally open to receive the transfer arm and the wafer carried by it, and the electrode mechanism is vertically indexed so that an empty plasma-discharge region is located at the correct level to allow the wafer to be released into the accommodating electrode recess when the transfer arm 26 has been moved to a fully-extended position. Thereafter, the transfer arm is retracted and the cassette is further lowered to cause another wafer to be engaged, held and carried over into the next empty plasma-discharge region, the electrode mechanism meanwhile being vertically indexed to bring that next region to the appropriate loading level. Slide rods 29 and a motor-driven screw-threaded drive rod 30 serve to guide and adjust the vertical elevator-like motions of the multiple-electrode mechanism with its supporting carrier platform 31; indexing is preferably wholly automatic and programmed for control in response to mechanical switches or other sensors, although it may be under operator control instead. Once the discharge regions have been loaded with wafers, the electrodes are sealed within an airtight chamber (not shown), and after purging and introduction of selected inert gas or gases have taken place, RF excitation of the electrodes in a manner described more fully hereinafter causes plasmas to be generated and to interact with the wafers until a desired processing has occurred. When the chamber is subsequently re-opened, the processed wafers may be removed or unloaded and brought back to the cassette by actions which are generally the reverse of those described for the loading.

In FIG. 2, the illustrated fragment of the multiple-electrode mechanism 13 includes the composite electrode units 22 and 23, between which is defined the plasma discharge region 13$d$. Wafer 15 and transport arm 26 are also depicted, together with arrows 32 characterizing the opposite directions in which the arm is extended and drawn back in the course of loading and unloading a wafer into and from the region 13$d$ where the intended interactions with gas plasma take place. The tip of arm 26 is accommodated within the laterally-extending slot 23A of the upper metallic planar conductor electrode plate 23$a$ upon which a wafer is to be rested for processing, within the shallower generally-circular recess 23B. Although electrode plate 23$a$ is the upper of the composite electrode-unit elements, it is of course the lower electrode plate of planar conductors bordering the plasma-discharge region 13$d$, the other bordering-planar conductor being plate 22$b$ of the unit 22. It is usually important that the electrode plates define plasma discharge regions which have a uniform thickness, 33, and therefore the electrode units 19–25 are maintained securely in horizontal parallel relationship, one above the other, by uprights 34–37 of insulating material into which the electrode units are recessed slightly along edges as shown. Electrical considerations dictate that the various electrode plates be polarized and powered in predetermined fashion, and the conductive members 34$a$–37$a$ which overlie the insulating uprights provide the means for making appropriate connections with only certain of the electrode plates and at spaced positions which have been found to be beneficial at the relatively high frequencies and powers involved (example: 13+MHz; 1000 watts). It has been found that reproducibility of processing results is improved when wafer or other workpiece temperatures are kept substantially the same, and also that certain other unwanted reactions with "resist" material seem to be reduced when the wafers are cooled, and for such reasons the upper wafer-supporting electrode plates, such as 22$a$ and 23$a$, are constructed with internal flow passageways for a coolant such as water or ethylene glycol which is forced through them in succession by way of couplings 38 (FIG. 3).

A key factor contributing to improved electrical characteristics of the system, as well as to its important overall small height, is the construction of and interrelationships between the several composite electrode units, 19–25. Each involves upper and lower conductive metallic plate electrodes, distinguished by the subscripts a and b, respectively, in sandwiching relation to an intermediate insulating and dielectric layer, distinguished by the subscript c, in the various views. Preferably, the dielectric layers 19$c$–25$c$ are of non-organic high-density alumina, although other materials, such as Teflon, may be used where the processing is not of a character such as to etch it and impair its intended functions. Thickness 39 (FIGS. 2 and 6) of the lower electrode plates 19$b$–25$b$ need not be larger than needed to preserve flatness and structural integrity in use, although thickness 40 of the upper electrode plates 19$a$–25$b$ must be large enough to allow for the aforementioned internal passageways through which liquid coolant is forced. In the case of the insulating dielectric layers 19$c$–25$c$, the thickness 41 must of course be sufficient to avoid breakdown at the voltages involved and to maintain inter-electrode impedance condition which will favor the creations of plasmas between the electrodes bordering the open discharge regions while the other electrode spacings are occupied by the dielectric. In one suitable construction, involving electrode plates and insulation-dielectric layers having lateral dimensions of about 6×6 inches, thickness 39 was about a quarter inch, thickness 40 about a half inch, and the insulation-dielectric layer thickness 41 (Teflon) about a quarter inch. Broken-linework arrows 42 (FIG. 2) characterize the vertical upward and downward movements which the electrode mechanism experiences on its supporting platform 31 (FIGS. 1, 3 and 4) as it is indexed to bring the plasma-discharge regions into position for automatic loading and unloading of the wafers.

Once one or a batch of workpiece slices or wafers is in place for interaction with plasma, the entire electrode assembly is sealed within a bell-jar type enclosure (a known type of arrangement, and represented schematically by dashed linework 43 in FIG. 4), and a suitable plasma-yielding gaseous medium, such as carbon tetrafluoride in one known practice, is admitted and kept freshly replenished there as RF excitation is applied to sustain a gas-discharge plasma in each of the regions 13$a$–13$f$. The techniques and implementations thereof for evacuating, purging, sealing, introducing and flowing gas or gases, and so forth, are established in the art and are not uniquely associated with the present teachings, and can be practiced by those skilled in the art, and hence are not discussed or represented in detail. However, the electrical excitations are distinctive and decidedly advantageous, and should be observed (FIG. 4) to involve simultaneous instantaneously-alike polarizations and energizing of all of the upper electrodes, 19$a$–25$a$, in the various composite electrodes, and likewise all of the lower electrodes, 19$b$–25$b$. RF source 44 provides such excitation, via its bus 44A which connect with lower electrodes 19$b$–25$b$ and its bus 44B which connects with the upper electrodes 19$a$–25$a$. The instantaneous polarities designated in FIG. 4 are intended to show the excitation conditions which may exist, with opposite-state polarities being distinguished by enclosures within parentheses. At any instant, all plasma regions 13$a$–13$f$ are polarized the same, as are all the wafer-supporting upper electrode plates 19$a$–25$a$, and that will therefore determine whether all etching is proceeding in the same mode. A grounded or floating condition for wafer-supporting anodes 19$a$–25$a$ will establish the aforementioned plasma or chemical plasma etching mode, for example, while operation of 19a–25a as powered cathodes involves the aforementioned RIE (reactive ion etching) mode of operation. By way of distinction, the arrangement in FIG. 5, which includes only single electrodes 19'–25', will be seen to involve instantaneously-opposite, rather than like, polarizations of the wafer-supporting electrodes and of the plasma regions, such that the processings are not the same in successive regions. In the latter showing, distinguishing single-prime accents are applied to reference characters designating counterparts of illustrations in the other illustrations, as a convenience in disclosure. Apparatus such as that of FIG. 5 has more limited capability, and, if only alternate plasma regions are used, for example, fewer wafers can be processed and the electrode mechanism is necessarily very much higher than comparable-capacity apparatus of the FIG. 4 construction.

At the radio frequencies involved (such as the aforementioned 13+MHz), power distribution to electrodes proportioned and spaced and disposed in relation to other parts of the system tends not to be a wholly straightforward matter. Specifically, the interests of uniform and repeatable processings of many workpieces tend to be defeated by simple direct connections of a source 44 with the numerous electrode plates, because it seems that they are not witnessing or exhibiting identical excitations and powering, for whatever reasons. One of the remedies which provides some improvement in those respects involves the fabrication of feeder elements 44B (FIG. 4) in the form of the conductive members 36a and 37a appearing in FIG. 3. There, each of the elongated members 36a and 37a is slotted lengthwise, centrally, and has a central tongue portion depending from the top, the latter portion being directly connected to the wafer-supporting plates of the electrode units 19–25. RF input coupled to those "transmission-line" type bus members via feeders 44B at the bottom is distributed to the wafer-supporting electrodes more uniformly than when plain bus connections are employed. Performance in those same respects can be even more readily controlled when matching and tuning are effected with the use of variable impedance as shown in FIG. 9. Output of a supply such as that delivered by 50-ohm output cable 46 of RF supply 47 is there matched to a useful extent with the input to the electrode assembly 13 by way of an adjustable shunt capacitance 48 and an adjustable series inductance 49, and the excitations therefrom to the individual wafer-supporting upper electrode plates of electrode units 19–25 are by way of separate variable capacitances 50,51–56 each in series with the input leads to those plates. Splits of the common excitation to the individual electrode plates may be achieved empirically by setting the latter capacitances, determining what degree of etching occurs in each plasma region, re-adjusting the capacitances, observing the changes, and continuing the testing and re-adjusting procedures until the etching effects are found to be well balanced. A further adjustable capacitance, 57, in series with the input to all the electrode plates, serves as a means for further tuning-out of stray effects developed between the electrode structure and nearby walls and other possibly disrupting materials and fields. The electrodes excited through the adjustable impedances may be the opposite of what is illustrated, in an alternative operational mode.

FIGS. 7 and 8 illustrate a preferred construction which facilitates the efficient circulation of the coolant through the wafer-supporting electrode plates. Two parallel spaced elongated bores 58 and 59 each merge separately with several obliquely-inclined elongated passageways, 60 and 61, respectively, machined into the plate 23 from one lateral edge at the site of a pre-formed small cavity 62. Once the machining has taken place, cavity 62 is capped and sealed along the side of the plate, and fluid couplings communicating with the two bore openings will carry the coolant into and out of the plate. The multiple passageways within will insure that coolant must traverse broad areas in its coursing, and that good regulation of electrode temperature will be promoted.

It should be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What we claim as new and desire to secure by Letters Patent of the United States is:

1. Apparatus for interacting gas plasma with workpieces, comprising chamber means including means for providing within it gaseous environment from which plasma can be generated under influence of applied electrical potentials, a multi-electrode assembly for applying said potentials across separated proximate regions each accommodating at least one workpiece within said chamber means, said assembly including a plurality of electrode units spaced apart by said regions and each having a pair of conductive electrodes and a solid dielectric material therebetween, and means for establishing different electrical potentials simultaneously at the conductive electrodes of each pair of electrodes.

2. Apparatus for interacting gas plasma with workpieces as set forth in claim 1, wherein said conductive electrodes are uniformly spaced and said dielectric material in each of said units substantially fills the volume between the electrodes thereof, the thickness of said dielectric material in said units being less than that of the said regions between said units.

3. Apparatus for interacting gas plasma with workpieces as set forth in claim 2 wherein said conductive electrodes are substantially planar and parallel, wherein said electrode units are of substantially the same size and substantially parallel and aligned with one another, wherein said regions are of substantially the same volume and thickness, and wherein said means for establishing said potentials produces like instantaneous potentials of the same sense across all of said regions.

4. Apparatus for interacting gas plasma with workpieces as set forth in claim 3 wherein said conductive electrodes are substantially horizontal and said regions are in vertically-stacked relationship, upper electrodes of said units being adapted to receive and support workpieces thereon.

5. Apparatus for interacting gas plasma with workpieces as set forth in claim 3 wherein said means for establishing said potentials comprises a source of radio-frequency signals, impedance matching means for coupling said source with all of said electrodes to apply said potentials thereacross, and means for splitting the radio-frequency power output from said impedance matching means substantially equally between adjacent sets of electrodes.

6. Apparatus for interacting gas plasma with workpieces as set forth in claim 5 wherein corresponding ones of each of the pairs of said electrodes is grounded, and wherein said impedance-matching means comprises an adjustable inductance in series with an ungrounded output lead from said source and an adjustable capacitance shunted across said lead and said grounded electrodes.

7. Apparatus for interacting gas plasma with workpieces as set forth in claim 5 wherein said means for splitting said radio-frequency power output comprises adjustable capacitances in series with corresponding ones of each of the pairs of said electrodes.

8. Apparatus for interacting gas plasma with workpieces as set forth in claim 7 further comprising adjustable capacitance means in series with all of the adjustable capacitance means of the pairs of said electrodes.

9. Apparatus for etching workpieces such as semiconductor wafers by exposure to gas plasma, comprising chamber means including means for providing within it a gaseous environment from which plasma can be generated under influence of applied electrical potentials, a vertically-stacked multi-electrode assembly for applying said potentials similarly across all of an aligned series of separate plasma-discharge regions each accommodating a workpiece within said chamber means, said assembly including a plurality of substantially horizontal electrode units each having a pair of substantially planar electrodes with substantially the same lateral dimensions and shape and a fill of solid dielectric material of substantially uniform thickness therebetween, said assembly further including a support structure having uprights mounting said electrode units at the edges thereof in insulated vertically-stacked and aligned relation to one another and with the same uniform-height spacing therebetween defining said separate plasma-discharge regions, said thickness of said full of dielectric material being less than the height of said spacing, and upper electrodes of said units being adapted to receive and support workpieces thereon, and means for applying substantially the same radio-frequency excitation at each instant across electrodes of said units which border the top and bottom of each of said regions to thereby generate substantially identical plasma conditions simultaneously in all of said regions.

10. Apparatus for etching workpieces as set forth in claim 9 further comprising a workpiece-transfer station including means alongside said assembly of electrode units for receiving a cassette with vertically-stacked workpieces therein, and a workpiece-transfer arm operatively associated with actuating and control means which moves said arm between extended and retracted positions and causes said arm transfers workpieces sequentially between their positions is said cassette and the portions of said upper electrodes which are adapted to receive and support them.

11. Apparatus for etching workpieces as set forth in claim 10 further including means for elevating and lowering said support structure to bring said regions and said portions of said upper electrodes into position for loading and unloading of workpieces by said workpiece-transfer arm.

12. Apparatus for etching workpieces as set forth in claim 9 wherein said workpiece-supporting upper electrodes of said units have passageways therethrough for guiding flow of coolant therethrough to maintain said upper electrodes cooled, and further comprising means for forcing liquid coolant through said upper electrodes while plasma is generated in said regions.

13. Apparatus for etching workpieces as set forth in claim 12 wherein said passageways in each of said upper electrodes are formed by a pair of spaced parallel elongated blind bores laterally therein each merged with a plurality of oblique elongated bores formed therein from the site of a cavity recessed into an edge thereof between said blind bores, said cavity being closed along said edge, the openings to said blind bores forming an inlet and outlet for the coolant flow through each of said upper electrodes.

14. Apparatus for etching workpieces as set forth in claim 9 wherein said means for applying substantially the same radio-frequency excitation at each instant comprises a source of radio-frequency electrical power, adjustable means for substantially matching the impedance at which the output of power is delivered from said source and the input impedance exhibited by the spaced and insulated planar electrodes, and means for splitting the radio-frequency power output from said adjustable means substantially equally between the several pairs of said electrodes.

15. Apparatus for etching workpieces as set forth in claim 14 wherein said adjustable means comprises an adjustable inductance in series with an ungrounded output conductor from said source and an adjustable capacitance shunted across said conductor and a grounded output conductor from said source.

16. Apparatus for etching workpieces as set forth in claim 14 wherein said means for splitting said output comprises a plurality of adjustable capacitances one each in series with each of said upper electrodes and connected with an ungrounded output conductor from said adjustable means.

17. Apparatus for etching workpieces as set forth in claim 14 further comprising adjustable capacitance means in series with all of said upper electrodes.

* * * * *